(12) United States Patent
Takahashi

(10) Patent No.: US 6,369,645 B1
(45) Date of Patent: *Apr. 9, 2002

(54) LOW-PASS FILTER WITH A SUMMING FUNCTION

(75) Inventor: Yutaka Takahashi, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/150,298

(22) Filed: Sep. 9, 1998

(30) Foreign Application Priority Data

Sep. 9, 1997 (JP) .............................................. 9-244134

(51) Int. Cl.[7] ................................................ H03K 5/00
(52) U.S. Cl. ...................................... 327/558; 327/552
(58) Field of Search ................................. 327/552, 558, 327/361, 344, 553, 554

(56) References Cited

U.S. PATENT DOCUMENTS

| | | | | | |
|---|---|---|---|---|---|
| 3,916,322 | A | * | 10/1975 | Nelson | 327/107 |
| 5,049,831 | A | * | 9/1991 | Weswick | 330/107 |
| 5,418,492 | A | * | 5/1995 | Wang et al. | 330/260 |
| 5,500,622 | A | * | 3/1996 | Muramatsu | 330/107 |
| 5,614,864 | A | * | 3/1997 | Stubbe et al. | 330/69 |

FOREIGN PATENT DOCUMENTS

| | | |
|---|---|---|
| JP | S63-300613 | 12/1988 |
| JP | 1-321716 | 12/1989 |
| JP | H8-307204 | 11/1996 |
| JP | H8-307205 | 11/1996 |
| JP | H10-312641 | 11/1998 |

OTHER PUBLICATIONS

D.E. Johnson eta l. ("A Handbook of Active Filters", 1980, pp. 32–33).*

* cited by examiner

Primary Examiner—Dinh T. Le
(74) Attorney, Agent, or Firm—Sughrue Mion, PLLC

(57) ABSTRACT

In a low-pass filter (10) having a filter input terminal (10-i1) supplied with a filter input signal ($V_1$) and comprising an operational amplifier (11) and other peripheral passive elements ($R_{in}$, $C_{in}$, $R_f$, $C_f$, $R_{1-1}$), the low-pass filter (10) further has an additional filter input terminal (10-i2) supplied with an additional filter input signal ($V_2$) and comprises an additional filter input resistor ($R_{1-2}$) connected between the additional filter input terminal (10-i2) and a common node ($a_0$). The operational amplifier (11) has an inverting input port (11-1), a noninverting input port (11-2) connected to the reference voltage terminal (12), and an amplifier output port (11-3) for producing an amplifier output signal. Connected to the amplifier output port (11-3) of the operational amplifier (11), a filter output terminal (10-o) produces the amplifier output signal as a filter output signal. Thereby, the low-pass filter (10) sums up the filter input signals ($V_1$, $V_2$) to obtain a summed signal and removes a high frequency component from the summed signal to make the filter output terminal (10-o) produce a low-pass filtered signal as the filter output signal.

2 Claims, 9 Drawing Sheets

LOW-PASS FILTER WITH A SUMMING FUNCTION

BACKGROUND OF THE INVENTION

This invention relates to a low-pass filter for removing a high-frequency component from an input signal and, in particular, to a low-pass filter with an adding function.

In prior art, an echo canceller or suppressor is used as one means realizing a two-way communication and is standardized by the American National Standards Institute (ANSI) T1. 601 in the integrated services digital network (ISDN).

In the two-way communication, transmission and reception are simultaneously carried out. As a result, a receiver side receives not only a received signal but also an echo signal where a transmission signal is turned back from a transmitter side to the receiver side. The received signal, which is transmitted via a transmission line, decays up to 50 dB but the echo signal only decays by about 6 dB because almost all of the transmission signal is turned back via a line transformer as the echo signal. Accordingly, there is a chance that the echo signal has a higher lever of 40 dB (a hundred times) or more in comparison with the received signal.

It is therefore necessary to remove the echo signal from the received signal in the receiver side. As a result, the receiving side comprises an adder for removing the echo signal from the received signal and a low-pass filter for preventing turned-back noises in an added signal. In prior art, the adder and the low-pass filter constitute a combinational circuit having an adding function and a low-pass filtering function, individually. In other words, the combinational circuit comprises the adder and the low-pass filter. In the manner which will later be described in conjunction with FIG. 2, each of the adder and the low-pass filter is implemented by an operational amplifier and other peripheral passive elements. As a result, a conventional combinational circuit is disadvantageous in that it has a large scale or size in circuitry and dissipates a significant amount of power.

On the other hand, an active filter is disclosed in Japanese Unexamined Patent Publication of Tokkai No. Hei 1-321, 716, namely, JP-A 1-321,716. The active filter according to JP-A 1-321,716 has a plurality of filter input terminals and a filter output terminal, and is implemented by only one operational amplifier and other peripheral passive elements. However, the active filter according JP-A 1-321,716 is a filter which has a summing function and a bandpass filtering function.

More specifically, the active filter according to JP-A 1-321,716 comprises a plurality of filter input resistors connected to a common node and the respective filter input terminals, an operational amplifier which has a predetermined gain and which has a positive input terminal, a negative input terminal connected to a reference voltage terminal, and an amplifier output terminal connected to the filter output terminal, a first amplifier input capacitor connected between the positive input terminal of the operational amplifier and the common node, a filter feedback resistor connected between the common node and the amplifier output terminal of the operational amplifier, and a second amplifier input capacitor and an amplifier input resistor which are connected between the positive input terminal of the operational amplifier and the reference voltage terminal in parallel.

SUMMARY OF THE INVENTION

It is therefore an object of the present invention to provide a low-pass filter with a summing function, which has a small scale or size in circuitry It is another object of the present invention to provide a low-pass filter of the type described, which is capable of suppressing dissipation of an amount of power.

Other objects of this invention will become clear as the description proceeds.

According to this invention, a low-pass filter comprises first through N-th filter input terminals supplied with first through N-th filter input signals, respectively, where N represents a positive integer which is not less than two. Connected to the first through the N-th filter input terminals, summing and low-pass filtering means sums up the first through the N-th filter input signals to obtain a summed signal and removes a high frequency component from the summed signal to produce a low-pass filtered signal. Connected to the summing and low-pass filtering means, a filter output terminal produces the low-pass filtered signal as a filter output signal.

According to a first aspect of this invention, a low-pass filter has first through N-th filter input terminals supplied with first through N-th filter input signals, respectively, where N represents a positive integer which is not less than two, and a reference voltage terminal supplied with a reference voltage. The low-pass filter comprises an operational amplifier having an inverting input port, a noninverting input port, and an amplifier output port for producing an amplifier output signal. The noninverting input port is connected to the reference voltage terminal. An amplifier input resistor has an end connected to the inverting input port of the operational amplifier and another end connected to a common node. An amplifier input capacitor is connected between the reference voltage terminal and the common node. A feedback resistor is connected between the common node and the amplifier output port of the operational amplifier. A feedback capacitor is connected between the inverting input port of the operational amplifier and the amplifier output port of the operational amplifier. First through N-th input impedance circuits are connected between the common node and the first through the N-th filter input terminals, respectively. Connected to the amplifier output port of the operational amplifier, a filter output terminal produces the amplifier output signal as a filter output signal. Thereby, the low-pass filter sums up the first through the N-th filter input signals to obtain a summed signal and removes a high frequency component from the summed signal to make said filter output terminal produce a low-pass filtered signal as the filter output signal.

According to a second aspect of this invention, a low-pass filter has first through N-th positive filter input terminals supplied with first through N-th positive filter input signals, respectively, where N represents a first positive integer which is not less than two, and first through M-th negative filter input terminals supplied with first through M-th negative filter input signals, respectively, where M represents a second positive integer which is not less than two. The low-pass filter comprises an operational amplifier having inverting and noninverting input ports, and inverting and noninverting amplifier output ports for producing inverted and noninverted amplifier output signals, respectively. A first amplifier input resistor has an end connected to the noninverting input port of the operational amplifier and another end connected to a positive common node. A second amplifier input resistor has end connected to the inverting input port of the operational amplifier and another end connected to a negative common node. An amplifier input capacitor is connected between the positive and the negative common nodes. A first filter feedback resistor is connected between the positive common node and the inverting amplifier output port of the operational amplifier. A second filter feedback resistor is connected between the negative common node and the noninverting amplifier output port of the operational amplifier. A first filter feedback capacitor is connected between the noninverting input port of the operational amplifier and the inverting amplifier output port of the operational amplifier. A second filter feedback capacitor is connected between the inverting input port of the operational amplifier and the noninverting amplifier output port of the operational amplifier. First through N-th positive input impedance circuits are connected between the positive common node and the first through the N-th positive filter input terminals, respectively. First through M-th negative input impedance circuits are connected between the negative common node and the first through the M-th negative filter input terminals, respectively. Connected to the inverting amplifier output port of the operational amplifier, an inverting filter output terminal produces the inverted amplifier output signal as an inverted filter output signal. Connected to the noninverting amplifier output port of the operational amplifier, a noninverting filter output terminal produces the noninverted amplifier output signal as a noninverted filter output signal.

DESCRIPTION OF THE PREFERRED EMBODIMENTS

Figure 1:
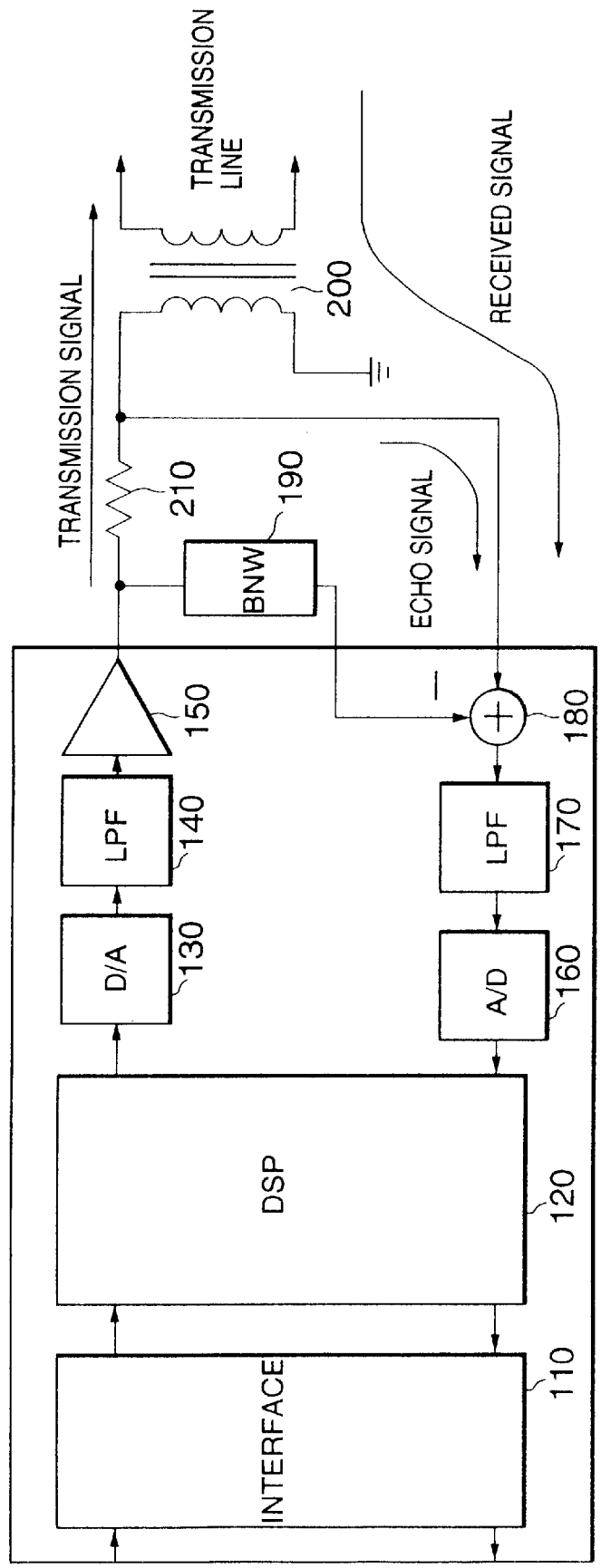
FIG. 1 is a block diagram of a conventional ISDN transceiver of an echo canceller type.

Referring to FIG. 1, a conventional ISDN transceiver of an echo canceller type will be described at first in order to facilitate an understanding of the present invention.

The illustrated ISDN transceiver comprises an interface 110, a digital signal processor (DSP) 120, a digital-to-analog (DA) converter 130, a low-pass filter (LPF) 140, a driver 150, an analog-to-digital (AD) converter 160, a low-pass filter (LPS) 170, and an adder 180.

Transmission data is supplied to the digital-to-analog converter 130 via the interface 110 and the digital signal processor 120. The digital-to-analog converter 130 converts the transmission data into an analog transmission signal. The analog transmission signal is supplied to the low-pass filter 140. The low-pass filter removes a high-frequency component from the analog transmission signal to produce a low-pass filtered transmission signal. The low-pass filtered transmission signal is supplied to the driver 150. The driver 150 sends the low-passed filtered transmission signal as a transmission signal to a transmission line via a resistor 210 and a line transformer 200.

The ISDN transceiver is provided with a balance network (BNW) 190. The balance network 190 is a lumped constant or parameter circuit for simulating a transfer characteristic of an echo pass. The balance network 190 is supplied with the transmission signal from the driver 150. Responsive to the transmission signal, the balance network 190 generates a pseudo-echo signal. The pseudo-echo signal is supplied to the adder 180.

On the other hand, the adder 180 is supplied with a received signal via the line transformer 200 with a wrap-around echo signal superimposed with the received signal. The adder 180 removes the echo signal from the received signal by subtracting the pseudo-echo signal from a combination of the received signal and the echo signal. The adder 180 produces an added signal which is supplied to the low-pass filter 170. The low-pass filter 170 removes a high-frequency component from the added signal to produce a low-pass filtered signal. The low-pass filtered signal is supplied to the analog-to-digital converter 160. The analog-to-digital converter 160 converts the low-pass filtered signal in to received data. The reception data is supplied to a user via the digital signal processor 120 and the interface 110.

However, it is impossible to perfectly remove the echo signal from the received signal using only the balance network 190 and the adder 180. This is because the balance network 190 is the lumped constant circuit having finite number of elements while the transmission line is a distributed constant or parameter circuit where its transfer characteristic varies on the basis of a length of the transmission line.

Therefore, a remaining echo signal is removed in the digital signal processor 120. For that purpose, it is necessary not only to convert an analog signal into a digital signal by the analog-to-digital converter 160 but also to be provided with the low-pass filter 170 for preventing turned-back noises at the preceding stage of the analog-to-digital converter 160.

Figure 2:
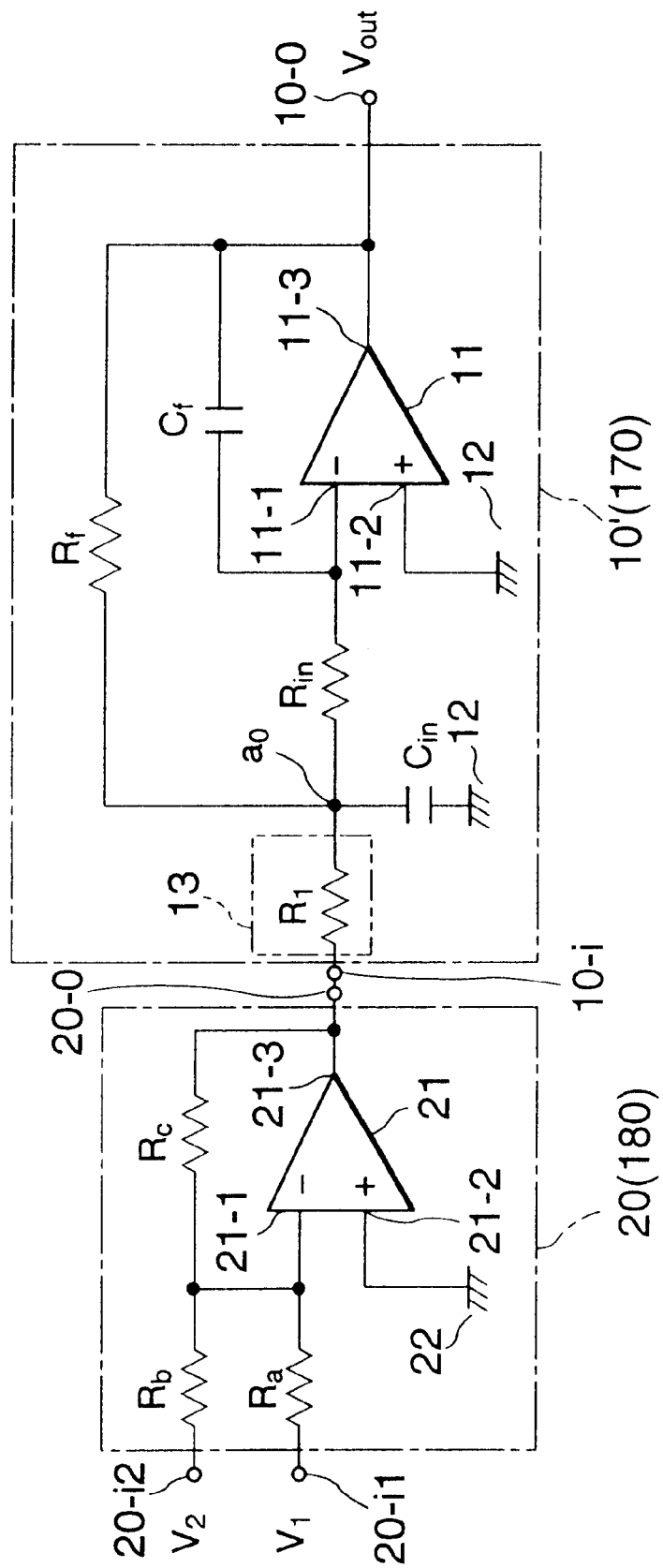
FIG. 2 is a circuit diagram of a conventional combinational circuit having an adding function and a low-pass filtering function.

Referring to FIG. 2, the description will proceed to a conventional combinational circuit having an adding function and a low-pass filtering function. The illustrated combinational circuit comprises an adder 20 corresponding to the adder 180 and a low-pass filter 10' corresponding to the low-pass filter 170. Each of the adder 20 and the low-pass filter 10' is implemented by an operational amplifier and other peripheral passive elements in the manner which will presently be described.

More specifically, the adder 20 has first and second circuit input terminals 20-i1 and 20-i2 which are supplied with first and second circuit input signals $V_1$ and $V_2$, respectively. The first and the second circuit input terminals 20-i1 and 20-i2 are called first and second adder input terminals supplied with the first and the second circuit input signals $V_1$ and $V_2$ as first and second adder input signals, respectively.

The adder 20 comprises an operational amplifier 21, three resistors $R_a$, $R_b$, and $R_c$. The resistors $R_a$, $R_b$, and $R_c$ are called first and second adder input resistors and an adder feedback resistor, respectively. The operational amplifier 21 has an inverting input port 21-1, an noninverting input port 21-2, and an amplifier output port 21-3. The inverting input port 21-1 is called a negative input terminal while the noninverting input port 21-2 is called a positive input terminal. The noninverting input port 21-2 of the operational amplifier 21 is connected to a reference voltage terminal 22 supplied with a reference voltage. In the example being illustrated, the reference voltage terminal 22 is an earth terminal supplied with a grounding or zero voltage as the reference voltage.

The first adder input resistor $R_a$ has an end connected to the first circuit input terminal 20-i1 and another end connected to the inverting input port 21-1 of the operational amplifier 21. In other words, the first adder input resistor $R_a$ is connected between the first circuit input part 20-i1 and the inverting input port 21-1 of the operational amplifier 21. Likewise, the second adder input resistor $R_b$ has an end connected to the second circuit input terminal 20-i2 and another end connected to the inverting input port 21-1 of the operational amplifier 21. In other words, the second adder input resistor $R_b$ is connected between the second circuit input terminal 20-i2 and the inverting input port 21-1 of the operational amplifier 21. The adder feedback resistor $R_c$ has an end connected to the inverting input terminal 21-1 of the operational amplifier 21 and another end connected to the amplifier output terminal 21-3 of the operational amplifier 21. In other words, the adder feedback resistor $R_c$ is connected between the inverting input terminal 21-1 of the operational amplifier 21 and the amplifier output terminal 21-3 of the operational amplifier 21.

The adder 20 further has an adder output terminal 20-o connected to the amplifier output port 21-3 of the operational amplifier 21. The adder output terminal 20-o produces an adder output signal indicative of an addition result of the first and the second circuit input signals $V_1$ and $V_2$.

The low-pass filter 10' has a filter input terminal 10-i and a circuit output terminal 10-o. The filter input terminal 10-i is connected to the adder output terminal 20-o of the adder 20. The filter input terminal 10-i is supplied with the adder output signal as a filter input signal. The circuit output terminal 10-o produces a circuit output signal $V_{out}$. The circuit output terminal 10-o is called a filter output terminal for producing the circuit output signal $V_{out}$ as a filter output signal.

The low-pass filter 10' comprises an operational amplifier 11, an amplifier input resistor $R_{in}$, an amplifier input capacitor $C_{in}$, a filter feedback resistor $R_f$, a filter feedback capacitor $C_f$, and a filter input resistor $R_1$.

The operational amplifier 11 is an inverting input port 11-1, an noninverting input port 11-2, and an amplifier output port 11-3 connected to the filter output terminal 10-o. The inverting input port 11-1 is called a negative input terminal while the noninverting input port 11-2 is called a positive input terminal. The noninverting input port 11-2 of the operational amplifier 11 is connected to a reference voltage terminal 12 supplied with a reference voltage. In the example being illustrated, the reference voltage terminal 12 is an earth terminal supplied with a grounding or zero voltage as the reference voltage.

The amplifier input resistor $R_{in}$ has an end connected to the inverting input port 11-1 of the operational amplifier 11 and another end connected to a common node $a_0$. In other words, the amplifier input resistor $R_{in}$ is connected between the inverting input port 11-1 of the operational amplifier 11 and the common node $a_0$. The amplifier input capacitor $C_{in}$ is connected to the reference voltage terminal 12 and the common node $a_0$. The filter feedback resistor $R_f$ is connected between the common node $a_0$ and the amplifier output port 11-3 of the operational amplifier 11. The filter feedback capacitor $C_f$ is connected between the inverting input port 11-1 of the operational amplifier 11 and the amplifier output port 11-3 of the operational amplifier 11.

The filter input resistor $R_1$ has an end connected to the filter input terminal 10-i and another end connected to the common node $a_0$. That is, the filter input resistor $R_1$ is connected between the filter input terminal 10-i and the common node $a_0$. The filter input resistor $R_1$ constitutes an input impedance circuit 13.

With this structure, it will be assumed that the first and the second circuit input signals $V_1$ and $V_2$ are supplied to the first and the second circuit input terminals 20-i1 and 20-i2, respectively. In this event, the adder 20 adds the first circuit input signal $V_1$ to the second circuit input signal $V_2$ to make the adder output terminal 20-o produce the adder output signal indicative of the addition result of the first and the second circuit input signals $V_1$ and $V_2$. Subsequently, the low-pass filter 10' removes a high-frequency component of the adder output signal to make the filter output terminal 10-o produce the low-pass filtered signal as the circuit output signal $V_{out}$. The circuit output signal $V_{out}$ is represented by a following equation (1):

$$V_{out} = \frac{\frac{R_f}{R_1} \cdot \left(\frac{R_c V_2}{R_b} + \frac{R_c V_1}{R_a}\right)}{\left(\frac{j\omega}{\omega_c}\right)^2 + \left(\frac{j\omega}{\omega_c}\right) \cdot \frac{1}{Q} + 1} \quad (1)$$

where j represents an imaginary unit which is equal to $\sqrt{-1}$, $\omega$ represents an angular frequency, $\omega_c$ represents a cutoff angular frequency, and Q represents sharpness of resonance. In addition, the cutoff angular frequency $\omega_c$ and the reciprocal of the sharpness of resonance (1/Q) are represented by following equations (2) and (3):

$$\omega_c = \frac{1}{\sqrt{C_{in} C_f R_{in} R_f}}, \quad \text{and} \quad (2)$$

$$\frac{1}{Q} = \left(\frac{1}{R_1} + \frac{1}{R_{in}} + \frac{1}{R_f}\right) \cdot \sqrt{\frac{C_f R_{in} R_f}{C_{in}}}. \quad (3)$$

However, inasmuch as the conventional combinational circuit comprises the adder 20 and the low-pass filter 10' each of which is implemented by the operational amplifier and other peripheral passive elements, the conventional combinational circuit is disadvantageous in that it has a large scale or size in circuitry and dissipates a significant amount of power, as mentioned in the preamble of the instant specification.

Figure 3:
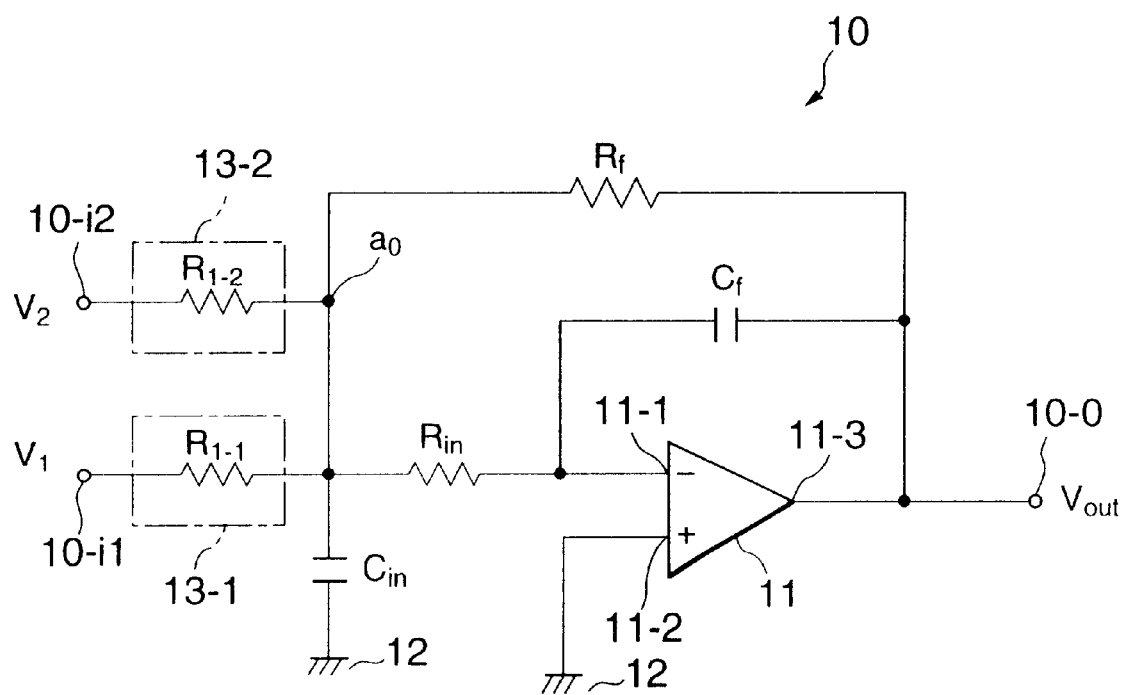
FIG. 3 is a circuit diagram of a low-pass filter according to a first embodiment of the instant invention.

Referring to FIG. 3, the description will proceed to a low-pass filter 10 according to a first embodiment of this invention. The low-pass filter 10 is similar and in structure and operation to the conventional low-pass filter 10' illustrated in FIG. 2 except that the low-pass filter 10 comprises first through N-th filter input terminals 10-i1 to 10-iN in lieu of the only one filter input terminal 10-i and first through N-th input impedance circuits 13-1 to 13-N in place of the only one input impedance circuit 13, where N represents a positive integer which is not less than two. Each of the second through the N-th filter input terminals 10-i2 to 10-iN is called an additional filter input terminal. Each of the second through the N-th input impedance circuits 13-1 to 13-N is referred to as an additional input impedance circuit. The illustrated low-pass filter 10 is a second order low-pass filter with double feedback loop with a summing function. In addition, the positive integer N is equal to two.

The first and the second filter input terminal 10-i1 and 10-i2 are supplied with first and second filter input signals $V_1$ and $V_2$, respectively. The second filter input signal $V_2$ is called an additional filter input signal. The first input impedance circuit 13-1 is connected between the common node $a_0$ and the first filter input terminal 10-i1 while the second input impedance circuit 13-2 is connected between the common node $a_0$ and the second filter input terminal 10-i2. The first input impedance circuit 13-1 comprises a primary filter input resistor $R_{1-1}$ connected between the common node $a_0$ and the first filter input terminal 10-i1. Similarly, the second input impedance circuit 13-2 comprises a secondary filter input resistor $R_{1-2}$ connected between the common node $a_0$ and the second filer input terminal 10-i2.

With this structure, an impedance as seen from the common $a_0$ to the operation amplifier 11 side is constant. As a result, two electric currents generated by the first and the second filter input signals $V_1$ and $V_2$ are added to obtain an added electric current and the added electric current is then converted into a voltage on the basis of a transfer function given or defined by the impedance in the common node $a_0$ to produce the voltage.

It will be presumed that the first and the second filter input signals $V_1$ and $V_2$ are supplied to the first and the second filter input terminals 10-i1 and 10-i2, respectively. In this event, addition of the first and the second filter input signals $V_1$ and $V_2$ and removal of a high-frequency component from an added signal are carried out in the low-pass filter 10 to make the filter output terminal 10-o produce a low-pass filtered signal as the filter output signal $V_{out}$. The filter output signal $V_{out}$ is represented by a following equation (4):

$$V_{out} = \frac{-\left(\frac{R_f V_2}{R_{1-2}} + \frac{R_f V_1}{R_{1-1}}\right)}{\left(\frac{j\omega}{\omega_0}\right)^2 + \left(\frac{j\omega}{\omega_0}\right) \cdot \frac{1}{Q} + 1} \quad (4)$$

where j represents an imaginary unit which is equal to $\sqrt{-1}$, $\omega$ represents an angular frequency, $\omega_0$ represents a cutoff angular frequency, and Q represents sharpness of resonance. In addition, the cutoff angular frequency $\omega_0$ and the reciprocal of the sharpness of resonance $(1/Q)$ are represented by following equations (5) and (6):

$$\omega_0 = \frac{1}{\sqrt{C_{in} C_f R_{in} R_f}}, \quad \text{and} \quad (5)$$

$$\frac{1}{Q} = \left(\frac{1}{R_{1-1}} + \frac{1}{R_{1-2}} + \frac{1}{R_{in}} + \frac{1}{R_f}\right) \cdot \sqrt{\frac{C_f R_{in} R_f}{C_{in}}}. \quad (6)$$

Figure 4:
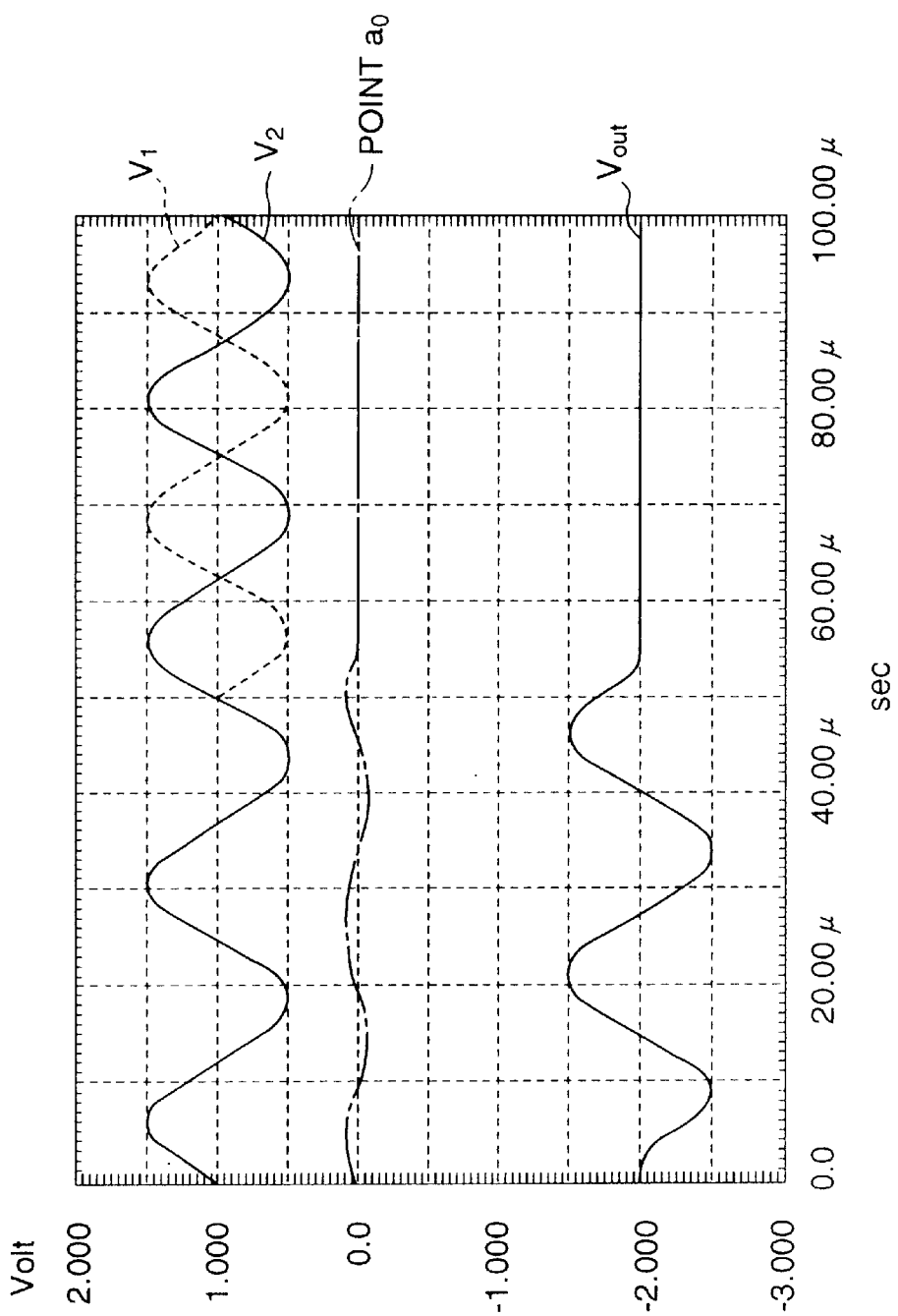
FIG. 4 shows a time chart for use in describing operation of the low-pass filter illustrated in FIG. 3.
Figure 5:
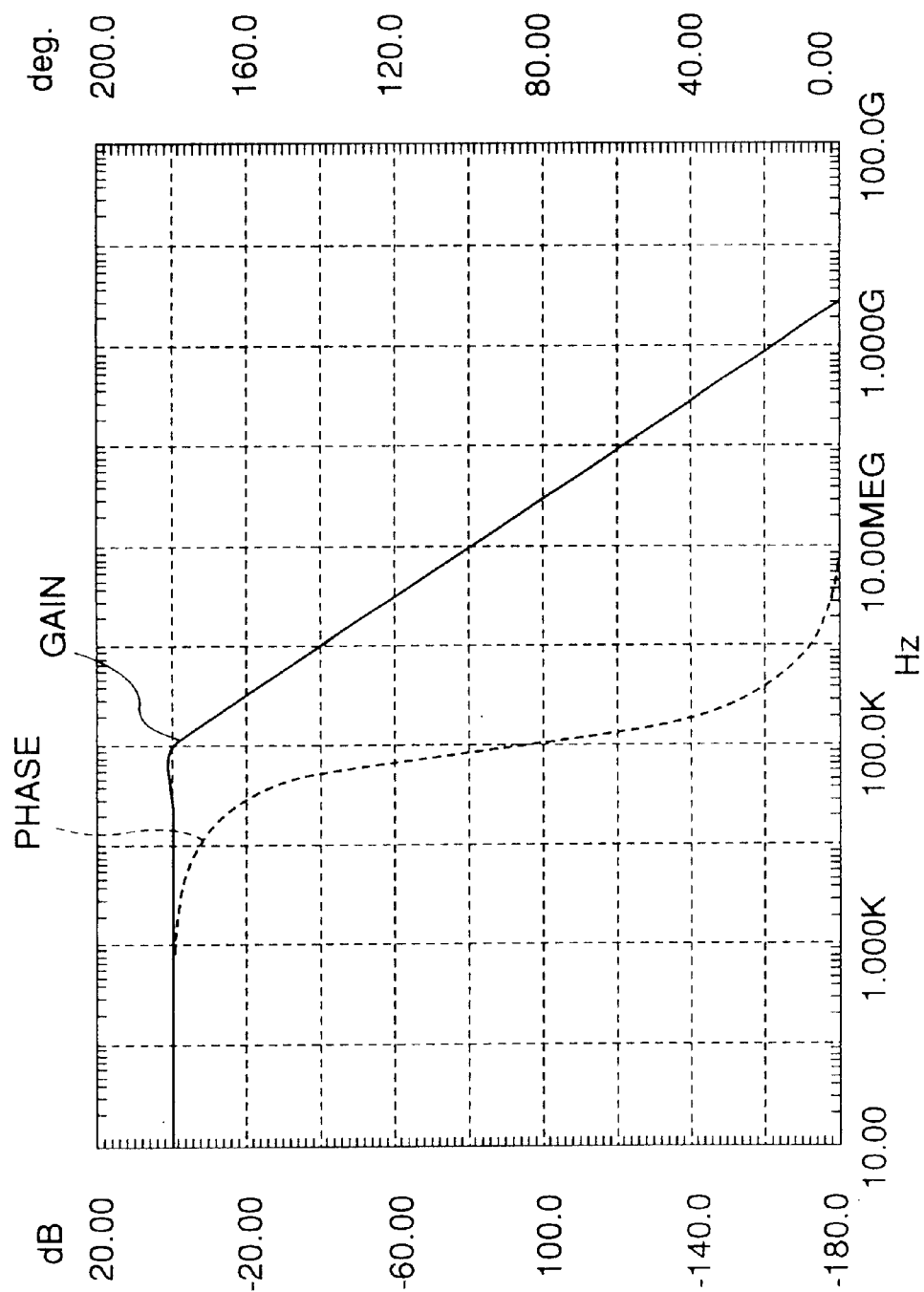
FIG. 5 shows a Bode diagram representing a frequency characteristic of the low-pass filter illustrated in FIG. 3.

Turning to FIGS. 4 and 5, description will be made about operation of the low-pass filter 10 illustrated in FIG. 3 by referring to simulation results. FIG. 4 shows a time chart for use in describing operation of the low-pass filter 10 illustrated in FIG. 3. In FIG. 4, the abscissa and the ordinate represent a time (sec) and voltages (volt), respectively. FIG. 5 shows a Bode diagram representing a frequency characteristic of the low-pass filter 10 illustrated in FIG. 3. In FIG. 5, the abscissa represents a frequency (Hz) and the ordinate represents a gain (dB) and a phase shift (deg.).

As shown in FIG. 4, it is understood that the filter output signal $V_{out}$ is a signal obtained by adding the first filter input signals $V_1$ supplied to the first filter input terminal 10-i1 to the second filter input signal $V_2$ supplied to the second filter input terminal. That is, FIG. 4 shows that the low-pass filter 10 has the adding or summing function.

In addition, as shown in FIG. 5, it is understood that the low-pass filter has the frequency characteristic where the gain of the low-pass filter 10 falls in a high frequency band and the phase shift of the low-pass filter 10 becomes small in the high frequency band. That is, FIG. 5 shows that the low-pass filter 10 has a function as a second order low-pass filter.

Although the low-pass filter 10 has two filter input terminals 10-i1 and 10-i2 for inputting two filter input signals $V_1$ and $V_2$ to be added or summed in the above-mentioned first embodiment, the low-pass filter may have three or more filter input terminals. Under the circumstances, it is possible to increase the number of filter input signals which should be added or summed up.

Figure 6:
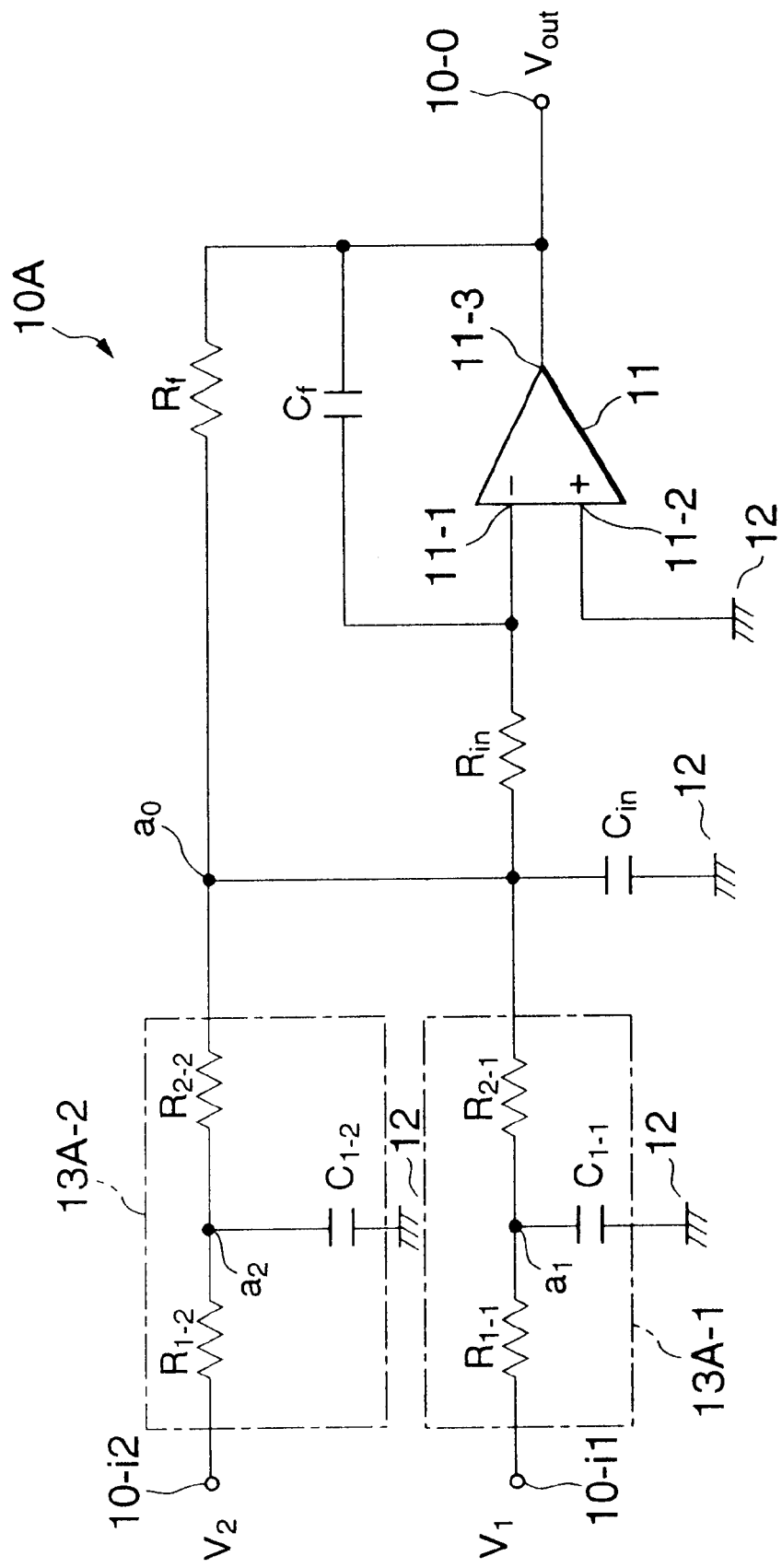
FIG. 6 is a circuit diagram of a low-pass filter according to a second embodiment of the instant invention.

Referring to FIG. 6, the description will proceed to a low-pass filter 10A according to a second embodiment of this invention. The low-pass filter 10A is similar and in structure and operation to the low-pass filter 10 illustrated in FIG. 3 except that the first and the second input impedance circuits are modified from those illustrated in FIG. 3 as will later become clear. The first and the second input impedance circuits are therefore depicted at 13A-1 and 13A-2, respectively. The illustrated low-pass filter 10A is a third order low-pass filter with double feedback loop with a summing function.

The first input impedance circuit 13A-1 comprises first and second primary filter input resistors $R_{1-1}$ and $R_{2-1}$ which are connected between the common node $a_0$ and the first filter input terminal 10-i1 in series, and a primary filter input capacitor $C_{1-1}$ which is connected between the reference voltage terminal 12 and a first connection $a_1$ between the first and the second primary filter input resistors $R_{1-1}$ and $R_{2-1}$.

Similarly, the second input impedance circuit 13A-2 comprises first and second secondary filter input resistors $R_{1-2}$ and $R_{2-2}$ which are connected between the common node $a_0$ and the second filer input terminal 10-i2 in series, and a secondary filter input capacitor $C_{1-2}$ which is connected between the reference voltage terminal 12 and a second connection $a_2$ between the first and the second secondary filter input resistors $R_{1-2}$ and $R_{2-2}$.

With this structure, it will be assumed that the first and the second filter input signals $V_1$ and $V_2$ are supplied to the first and the second filter input terminals 10-i1 and 10-i2, respectively. In this event, in the similar manner which is described as regards the low-pass filter 10 according to the above-mentioned first embodiment, addition of the first and the second filter input signals $V_1$ and $V_2$ and removal of a high-frequency component from an added signal are carried out in the low-pass filter 10A to make the filter output terminal 10-o produce a low-pass filtered signal as the filter output signal $V_{out}$.

Figure 7:
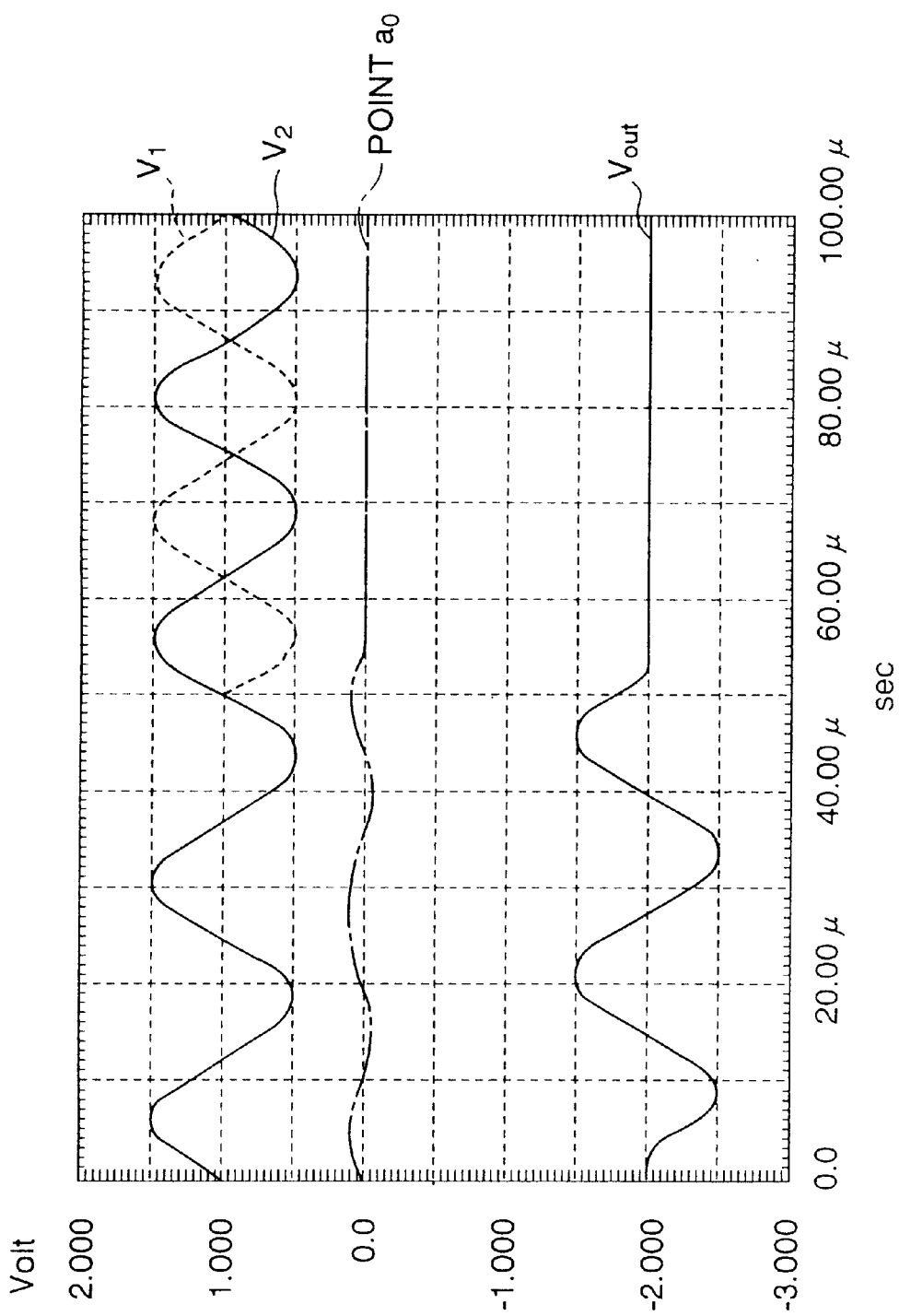
FIG. 7 shows a time chart for use in describing operation of the low-pass filter illustrated in FIG. 6.
Figure 8:
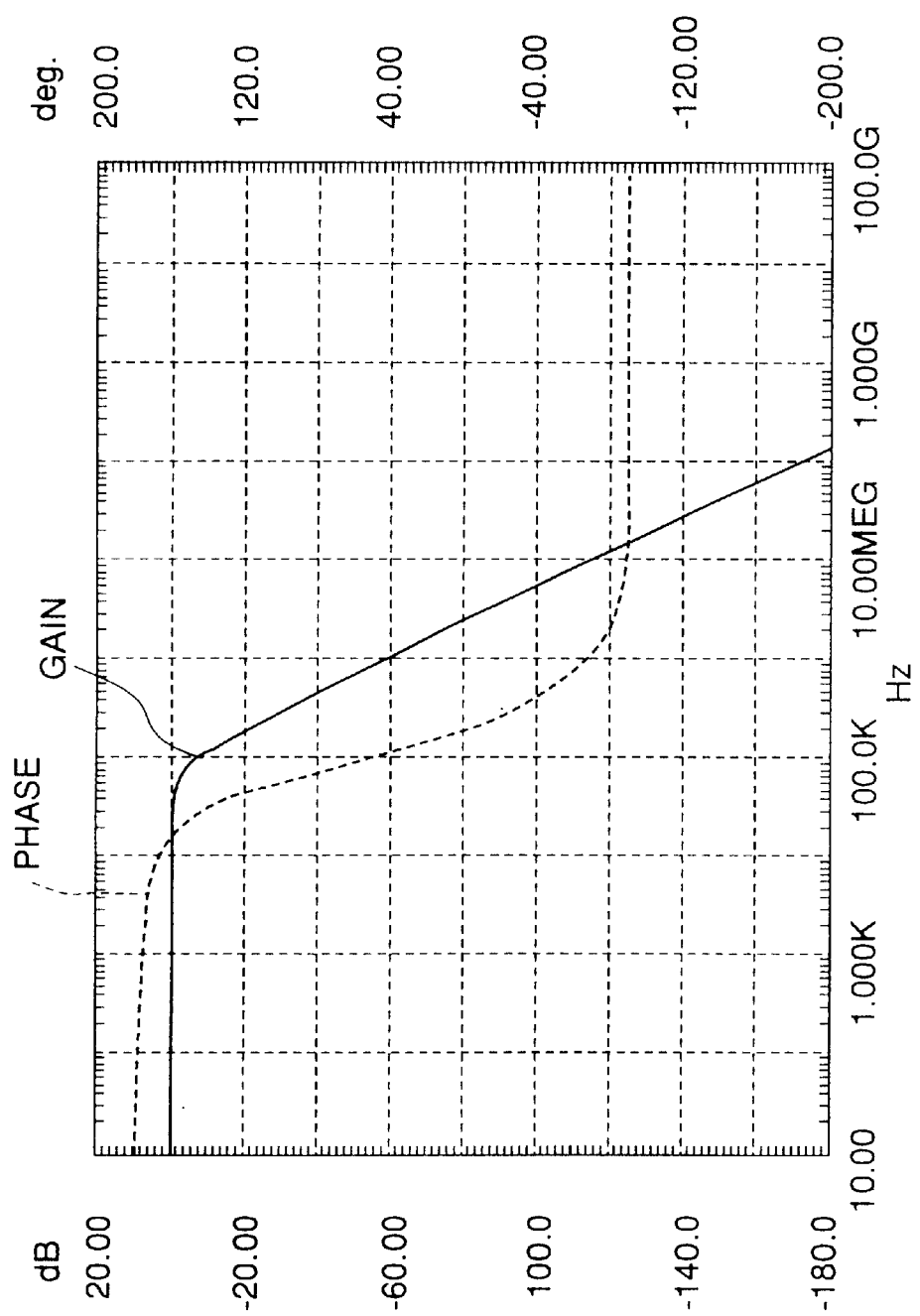
FIG. 8 shows a Bode diagram representing a frequency characteristic of the low-pass filter illustrated in FIG. 6.

Turning to FIGS. 7 and 8, description will be made about operation of the low-pass filter 10A illustrated in FIG. 6 by referring to simulation results. FIG. 7 shows a time chart for use in describing operation of the low-pass filter 10A illustrated in FIG. 6. In FIG. 7, the abscissa and the ordinate represent a time (sec) and voltages (volt), respectively. FIG. 8 shows a Bode diagram representing a frequency characteristic of the low-pass filter 10A illustrated in FIG. 6. In FIG. 8, the abscissa represents a frequency (Hz) and the ordinate represents a gain (dB) and a phase shift (deg.).

As shown in FIG. 7, it is understood that the filter output signal $V_{out}$ is a signal obtained by adding the first filter input signals $V_1$ supplied to the first filter input terminal 10-i1 to the second filter input signal $V_2$ supplied to the second filter input terminal. That is, FIG. 7 shows that the low-pass filter 10A has the adding or summing function.

In addition, as shown in FIG. 8, it is understood that the low-pass filter 10A has the frequency characteristic where the gain of the low-pass filter 10A falls in a high frequency band and the phase shift of the low-pass filter 10A becomes small in the high frequency band. That is, FIG. 8 shows that the low-pass filter 10A has a function as a third order low-pass filter.

Although the low-pass filter 10A has two filter input terminals 10-i1 and 10-i2 for inputting two filter input signals $V_1$ and $V_2$ to be added or summed in the above-mentioned second embodiment, the low-pass filter may have three or more filter input terminals. Under the circumstances, it is possible to increase the number of filter input signals which should be added or summed up.

Figure 9:
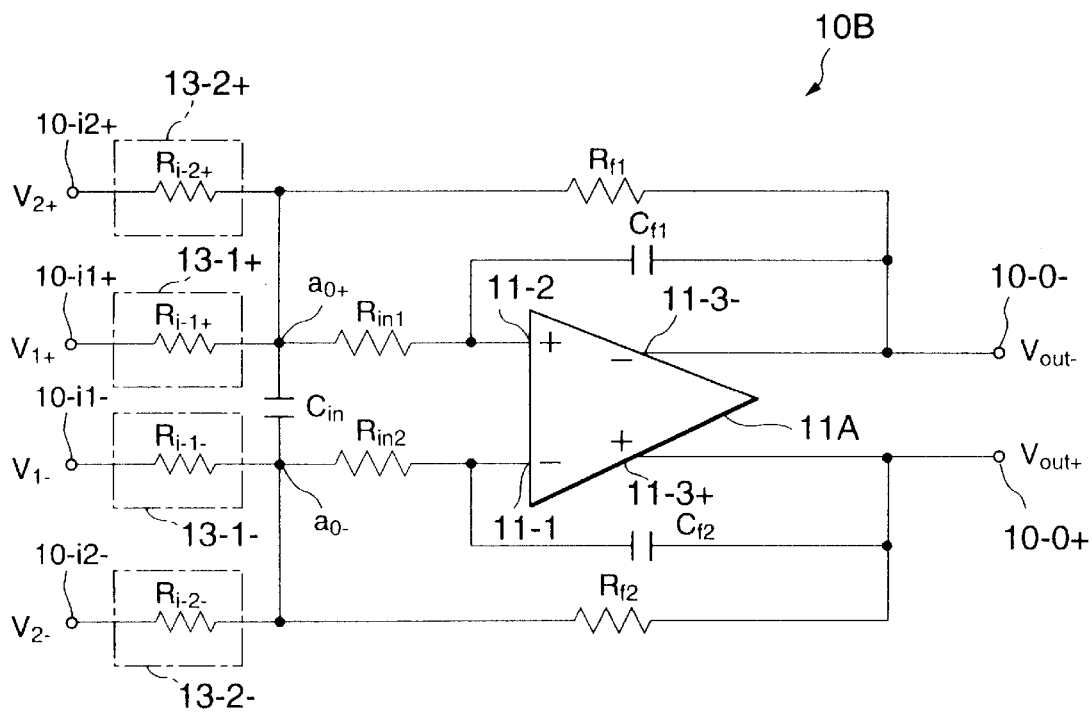
FIG. 9 is a circuit diagram of a low-pass filter according to a third embodiment of the instant invention.

Referring to FIG. 9, the description will proceed to a low-pass filter 10B according to a third embodiment of this invention. The low-pass filter 10B is a full differential type low-pass filter with a summing function.

The illustrated low-pass filer 10B has first through N-th positive filter input terminals 10-i1+ to 10-iN+ supplied with first through N-th positive input signals $V_{1+}$ to $V_{N+}$, respectively, where N represents a first positive integer which is not less than two, and has first through M-th negative filter input terminals 10-i1− to 10-iM− supplied with first through M-th negative input signals $V_{1-}$ to $V_{M-}$, respectively, where M represents a second positive integer which is not less than two. In the example being illustrate, each of the first and the second positive integers N and M is equal to two.

The low-pass filter 10B comprises an operational amplifier 11A, first and second amplifier input resistors $R_{in1}$ and $R_{in2}$, an amplifier input capacitor $C_{in}$, first and second filter feedback resistors $R_{f1}$ and $R_{f2}$, first and second filter feedback capacitors $C_{f1}$ and $C_{f2}$, first and second positive input us impedance circuits 13-1+ and 13-2+, and first and second negative input impedance circuits 13-1− and 13-2−.

The operational amplifier 11A has inverting and noninverting input ports 11-1 and 11-2, and inverting and noninverting amplifier output ports 11-3− and 11-3+ for producing inverted and noninverted amplifier output signals.

The first amplifier input resistor $R_{in1}$ has an end connected to the noninverting input port 11-2 of the operational amplifier 11A and another end connected to a positive common node $a_{0+}$. In other words, the first amplifier input resistor $R_{in1}$ is connected between the noninverting input port 11-2 of the operational amplifier 11A and the positive common node $a_{0+}$. Likewise, the second amplifier input resistor $R_{in2}$ has an end connected to the inverting input port 11-1 of the operational amplifier 11A and another end connected to a negative common node $a_{0-}$. The amplifier input capacitor $C_{in}$ is connected between the positive and the negative common nodes $a_{0+}$ and $a_{0-}$.

The first filter feedback resistor $R_{f1}$ is connected between the positive common node $a_{0+}$ and the inverting amplifier output port 11-3− of the operational amplifier 11A. Similarly, the second filter feedback resistor $R_{f2}$ is connected between the negative common node $a_{0-}$ and the noninverting amplifier output port 11-3+ of the operational amplifier 11A. The first filter feedback capacitor $C_{f1}$ is connected between the noninverting input port 11-2 of the operational amplifier 11A and the inverting amplifier output port 11-3− of the operational amplifier 11A. Similarly, the second filter feedback capacitor $C_{f2}$ is connected between the inverting input port 11-1 of the operational amplifier 11A and the noninverting amplifier output port 11-3+ of the operational amplifier 11A.

The first positive input impedance circuit 13-1+ is connected between the positive common node $a_{0+}$ and the first positive filter input terminal 10-i1+. Likewise, the second positive input impedance circuit 13-2+ is connected between the positive common node $a_{0+}$ and the second positive filter input terminal 10-i2+. Similarly, the first negative input impedance circuit 13-1− is connected between the negative common node $a_{0-}$ and the first negative filter input terminal 10-i1−. Likewise, the second negative input impedance circuit 13-2− is connected between the negative common node $a_{0-}$ and the second negative filter input terminal 10-i2−.

In the example being illustrated, the first and the second positive input impedance circuits 13-1+ and 13-2+ comprise first and second positive filter input resistors $R_{1-1+}$ and $R_{1-2+}$ which are connected between the positive common node $a_{0+}$ and the first and the second positive filter input terminals 10-i1+ and 10-i2+, respectively. Similarly, the first and the second negative input impedance circuits 13-1− and 13-2− comprise first and second negative filter input resistors $R_{1-1-}$ and $R_{1-2-}$ which are connected between the negative common node $a_{0\_}$ and the first and the second negative filter input terminals 10-i1− and 10-i2−, respectively.

The low-pass filter 10B further has an inverting filter output terminal 10-o− and a noninverting filter output terminal 10-0+. The inverting filter output terminal 10-o− is connected to the inverting amplifier output port 11-3− of the operational amplifier 11A. The inverting filter output terminal 10-o− produces the inverted amplifier output signal as an inverted filter output signal. Likewise, the noninverting filter output terminal 10-o+ is connected to the noninverting amplifier output port 11-3+ of the operational amplifier 11A. the noninverting filter output terminal 10-o+ produces the noninverted amplifier output signal as a noninverted filter output signal.

While this invention has thus far been described in conjunction with a few preferred embodiments thereof, it will now be readily possible for those skilled in the art to put this invention into various other manners.

What is claimed is:

1. A low-pass filter comprising:

first through N-th positive filter input terminals supplied with first through N-th positive filter input signals, respectively, where N represents a first positive integer which is not less than two;

first through M-th negative filter input terminals supplied with first through M-th negative filter input signals, respectively, where M represents a second positive integer which is not less than two;

an operational amplifier having inverting and noninverting input ports, and inverting and noninverting amplifier output ports for producing inverted and noninverted amplifier output signals, respectively;

a first amplifier input resistor having an end connected to the noninverting input port of said operational amplifier and another end connected to a positive common node;

a second amplifier input resistor having an end connected to the inverting input port of said operational amplifier and another end connected to a negative common node;

an amplifier input capacitor connected between the positive and the negative common nodes;

a first filter feedback resistor connected between the positive common node and the inverting amplifier output port of said operational amplifier;

a second filter feedback resistor connected between the negative common node and the noninverting amplifier output port of said operational amplifier;

a first filter feedback capacitor connected between the noninverting input port of said operational amplifier and the inverting amplifier output port of said operational amplifier;

a second filter feedback capacitor connected between the inverting input port of said operational amplifier and the noninverting amplifier output port of said operational amplifier;

first through N-th positive input impedance circuits connected between the positive common node and said first through said N-th positive filter input terminals, respectively;

first through M-th negative input impedance circuits connected between the negative common node and said first through said M-th negative filter input terminals, respectively;

an inverting filter output terminal, connected to the inverting amplifier output port of said operational amplifier, for producing the inverted amplifier output signal as an inverted filter output signal; and a noninverting filter output terminal, connected to the noninverting amplifier output port of said operational amplifier, for producing the noninverted amplifier output signal as a noninverted filter output signal.

2. A low-pass filter as claimed in claim 1, wherein said first through said N-th positive input impedance circuits comprise first through N-th positive filter input resistors connected between the positive common node and said first through said N-th positive filter input terminals, respectively, said first through said M-th negative input impedance circuits comprising first through M-th negative filter input resistors connected between the negative common node and said first through said M-th negative filter input terminals, respectively.

* * * * *